(12) United States Patent
Chan

(10) Patent No.: US 9,136,373 B2
(45) Date of Patent: Sep. 15, 2015

(54) SEMICONDUCTOR DEVICE AND MANUFACTURING METHOD FOR THE SAME

(71) Applicant: MACRONIX INTERNATIONAL CO., LTD., Hsinchu (TW)

(72) Inventor: Wing-Chor Chan, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 102 days.

(21) Appl. No.: 13/968,455

(22) Filed: Aug. 16, 2013

(65) Prior Publication Data

US 2015/0048451 A1  Feb. 19, 2015

(51) Int. Cl.
*H01L 29/66* (2006.01)
*H01L 29/78* (2006.01)

(52) U.S. Cl.
CPC ...... *H01L 29/7816* (2013.01); *H01L 29/66681* (2013.01); *H01L 29/66659* (2013.01); *H01L 29/7835* (2013.01)

(58) Field of Classification Search
CPC ............ H01L 29/7816; H01L 29/66681; H01L 29/7835; H01L 29/66659
USPC ......................... 257/328, 355, 353
See application file for complete search history.

(56) References Cited

U.S. PATENT DOCUMENTS

2010/0001345 A1* 1/2010 Furuhata et al. .............. 257/343

FOREIGN PATENT DOCUMENTS

TW  201312747 A  3/2013

OTHER PUBLICATIONS

TW Office Action dated Mar. 25, 2015 in corresponding Taiwan application (No. 102126049).

* cited by examiner

*Primary Examiner* — Ha Tran T Nguyen
*Assistant Examiner* — Aaron Dehne
(74) *Attorney, Agent, or Firm* — McClure, Qualey & Rodack, LLP

(57) ABSTRACT

A semiconductor device and a manufacturing method for the same are provided. The semiconductor substrate includes a gate structure, a first doped contact region, a second doped contact region and a well doped region. The gate structure is on the semiconductor substrate, and has a first gate sidewall and a second gate sidewall opposite to the first gate sidewall. The first doped contact region has a first type conductivity and is formed in the semiconductor substrate on the first gate sidewall of the gate structure. The second doped contact region has the first type conductivity and is formed in the semiconductor substrate on the second gate sidewall of the gate structure. The well doped region has the first type conductivity and is under the first doped contact region.

14 Claims, 7 Drawing Sheets

SEMICONDUCTOR DEVICE AND MANUFACTURING METHOD FOR THE SAME

BACKGROUND

1. Technical Field

The disclosure relates to a semiconductor device and a manufacturing method for the same, and more particularly to a semiconductor device having ESD protection function and a manufacturing method for the same.

2. Description of the Related Art

Semiconductor devices are used in elements for many products such as MP3 players, digital cameras, computer, etc. As the application increases, the demand for the semiconductor device focuses on small size and large circuit density. In the semiconductor technology, the feature size has been reduced. In the meantime, the rate, the efficiency, the density and the cost per integrated circuit unit have been improved.

Recently, a power-saving IC is a trend for development for a semiconductor device. The power-saving IC usually uses a LDMOS or an EDMOS as a switch. For example, a method for increasing a breakdown voltage (BVdss) of a semiconductor device such as a LDMOS or an EDMOS is decreasing a dopant concentration of a drain region or increasing a drift length.

Electrostatic discharge (ESD) is a phenomenon of electrostatic charge transfer between different objects with the accumulation of the electrostatic charges. The ESD occurs for an extremely short period of time, which is only within the level of several nano-seconds (ns). A very high current is generated in the ESD event, and the value of the current is usually several amperes. Consequently, once the current generated by the ESD flows through a semiconductor device, the semiconductor device is usually damaged due to high power density. Thus, the ESD protection device has to provide a discharge path to prevent the semiconductor device from being damaged when the electrostatic charges are generated in the semiconductor device by machine or human body.

SUMMARY

According to one embodiment, a semiconductor device is provided. The semiconductor substrate comprises a semiconductor substrate, a gate structure, a first doped contact region, a second doped contact region and a third doped contact region. The gate structure is on the semiconductor substrate and has a first gate sidewall and a second gate sidewall opposite to the first gate sidewall. The first doped contact region having a first type conductivity is formed in the semiconductor substrate on the first gate sidewall of the gate structure. The second doped contact region having the first type conductivity is formed in the semiconductor substrate on the second gate sidewall of the gate structure. The third doped contact region is surrounded by at least one of the first doped contact region and the second doped contact region. The third doped contact region has a second type conductivity opposite to the first type conductivity.

According to another embodiment, a semiconductor device is provided. The semiconductor substrate comprises a gate structure, a first doped contact region, a second doped contact region and a well doped region. The gate structure is on the semiconductor substrate, and has a first gate sidewall and a second gate sidewall opposite to the first gate sidewall. The first doped contact region has a first type conductivity and is formed in the semiconductor substrate on the first gate sidewall of the gate structure. The second doped contact region has the first type conductivity and is formed in the semiconductor substrate on the second gate sidewall of the gate structure. The well doped region has the first type conductivity and is under the first doped contact region.

According to yet another embodiment, a method for manufacturing a semiconductor device is provided. The method comprises following steps. A gate structure having a first gate sidewall and a second gate sidewall opposite to the first gate sidewall is formed on a semiconductor substrate. A first doped contact region having a first type conductivity is formed in the semiconductor substrate on the first gate sidewall of the gate structure. A second doped contact region having the first type conductivity is formed in the semiconductor substrate on the second gate sidewall of the gate structure. A third doped contact region surrounded by at least one of the first doped contact region and the second doped contact region is formed. The third doped contact region has a second type conductivity opposite to the first type conductivity.

According to yet another embodiment, a method for manufacturing a semiconductor device is provided. The method comprises following steps. A gate structure having a first gate sidewall and a second gate sidewall opposite to the first gate sidewall is formed on a semiconductor substrate. A first doped contact region having a first type conductivity is formed in the semiconductor substrate on the first gate sidewall of the gate structure. A second doped contact region having the first type conductivity is formed in the semiconductor substrate on the second gate sidewall of the gate structure. A well doped region having the first type conductivity is formed under the first doped contact region.

The above and other aspects of the disclosure will become better understood with regard to the following detailed description of the non-limiting embodiment(s). The following description is made with reference to the accompanying drawings.

DETAILED DESCRIPTION

Figure 1:
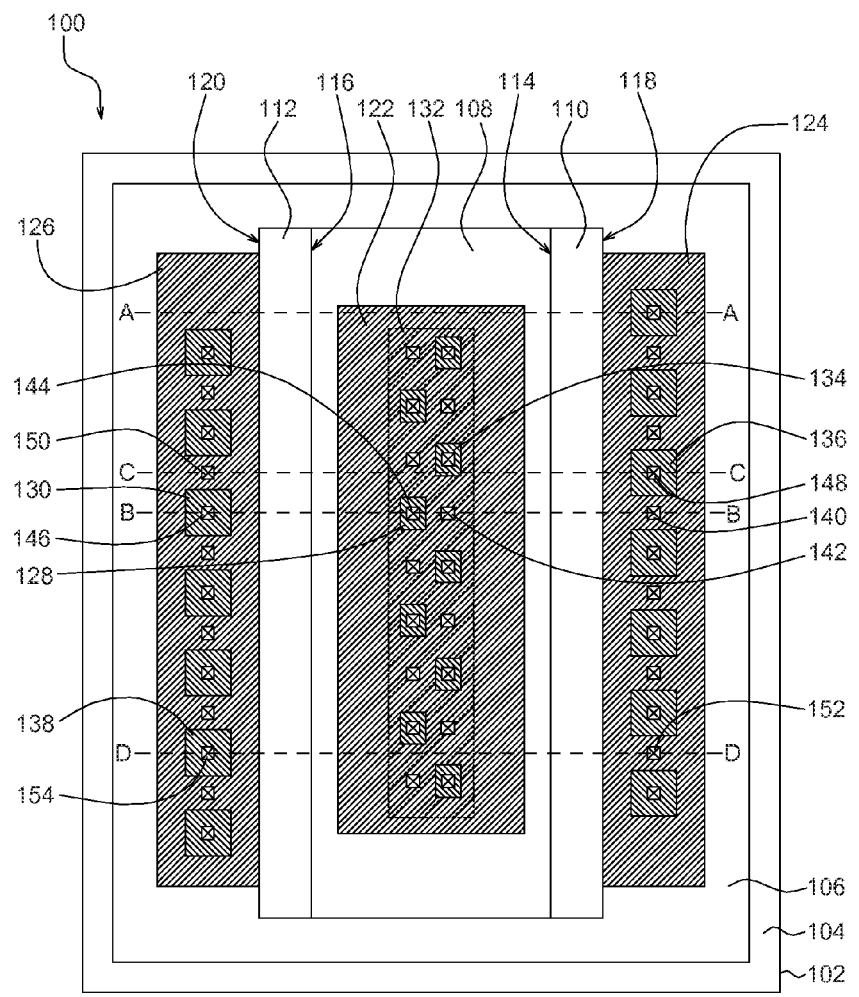
FIG. 1 illustrates a top view of some elements of a semiconductor device according to one embodiment.

FIG. 1 illustrates a top view of a semiconductor device 100 according to one embodiment. FIG. 2A, FIG. 2B, FIG. 2C and FIG. 2D respectively illustrate cross-section views of the semiconductor device 100 along AA line, BB line, CC line and DD line.

Figure 2A:
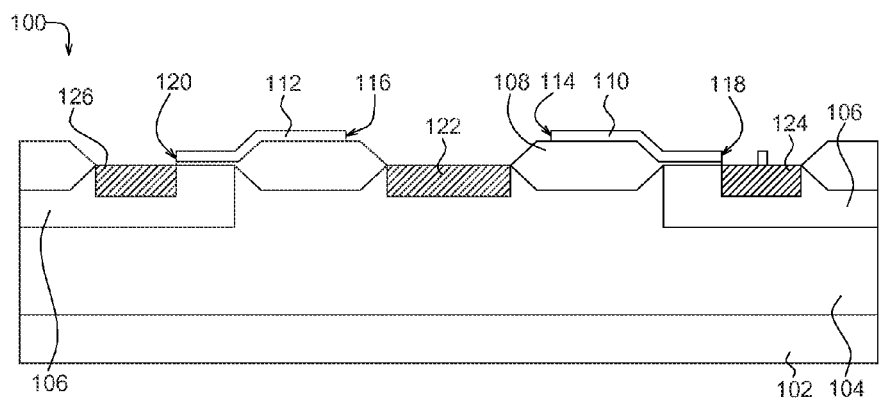
FIG. 2A illustrates a cross-section view of a semiconductor device according to one embodiment.

Referring to FIG. 2A, a first well region 104 is formed in a semiconductor substrate 102. A second well region 106 is formed in the first well region 104. A dielectric structure 108 is disposed on the first well region 104. Gate structures 110, 112 are disposed on the second well region 106. The gate structures 110 and 112 respectively have first gate sidewalls 114 and 116 and second gate sidewalls 118 and 120, as shown in FIG. 2A. A first doped contact region 122 is formed in the first well region 104 on the first gate sidewalls 114, 116 of the gate structures 110, 112, respectively. Second doped contact regions 124, 126 are formed in the second well region 106 on the second gate sidewalls 118, 120 of the gate structures 110, 112, respectively.

Figure 2B:
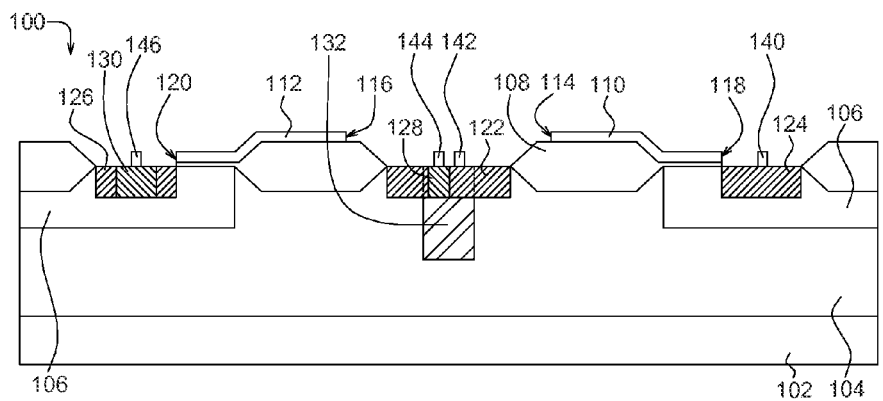
FIG. 2B illustrates a cross-section view of a semiconductor device according to one embodiment.

The cross-section view of the semiconductor device 100 as shown in FIG. 2B is different from that as shown in FIG. 2A in the following description. A third doped contact region 128 and a third doped contact region 130 are surrounded by the first doped contact region 122 and the second doped contact region 126, respectively (also referring FIG. 1). A well doped region 132 is under the first doped contact region 122.

Figure 2C:
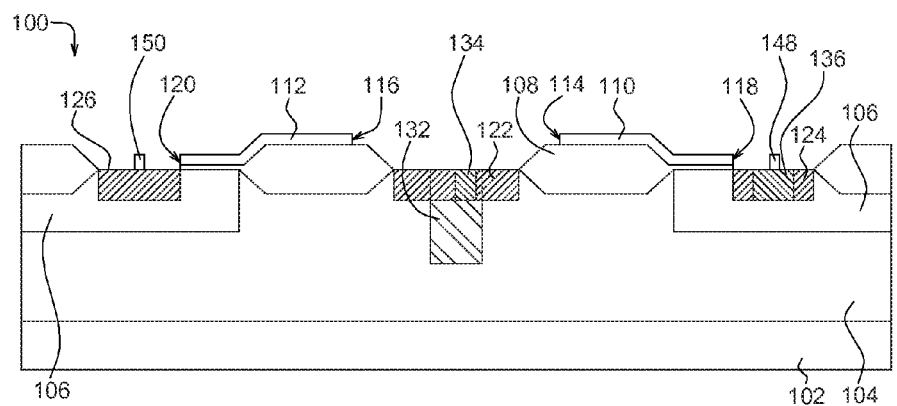
FIG. 2C illustrates a cross-section view of a semiconductor device according to one embodiment.

The cross-section view of the semiconductor device 100 as shown in FIG. 2C is different from that as shown in FIG. 2A in the following description. A third doped contact region 134 and a third doped contact region 136 are surrounded by the first doped contact region 122 and the second doped contact region 124, respectively (also referring to FIG. 1). The well doped region 132 is under the first doped contact region 122.

Figure 2D:
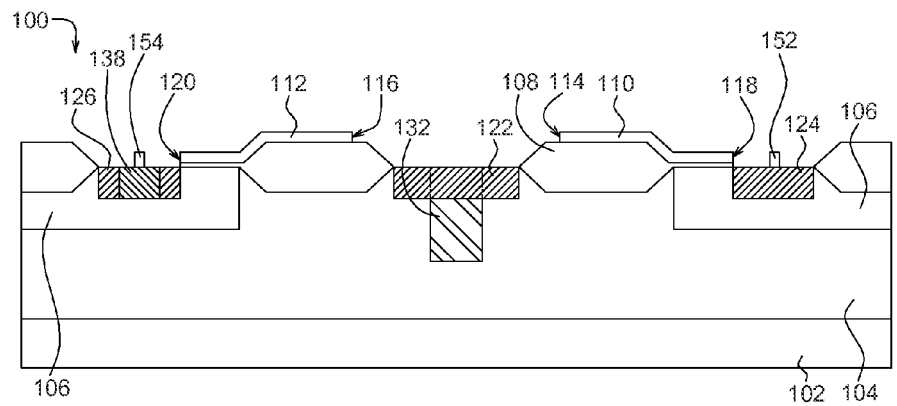
FIG. 2D illustrates a cross-section view of a semiconductor device according to one embodiment.

The cross-section view of the semiconductor device 100 as shown in FIG. 2D is different from that as shown in FIG. 2A in the following description. A third doped contact region 138 is surrounded by the second doped contact region 126 (also referring to FIG. 1). The well doped region 132 is under the first doped contact region 122.

In one embodiment, the semiconductor device 100 is an extended-drain MOSFET (EDMOS). In one embodiment, the semiconductor device 100 having a EDMOS structure characteristic is functioned as an ESD protection device having an electric characteristics same as an output driver EDMOS. In other words, a single semiconductor device 100 may be operated as an EDMOS and an ESD protection device, thus can save a total device area on a chip. In one example that the semiconductor device 100 has an EDNMOS structure characteristics, for example, the first well region 104, the first doped contact region 122, the second doped contact region 124, 126 and the well doped region 132 have a first type conductivity such as N-type conductivity, and the semiconductor substrate 102, the second well region 106 and the third doped contact region 128, 130, 134, 136, 138 having a second type conductivity, such as P-type conductivity, opposite to the first type conductivity. The first doped contact region 122 and the third doped contact regions (comprising the third doped contact regions 128, 134, etc.) surrounded by the first doped contact region 122 are electrically connected to a drain electrode. Moreover, the second doped contact regions 124, 126, and the third doped contact regions (comprising the third doped contact regions 130, 136, 138, etc.) surrounded by the second doped contact regions 124, 126 are electrically connected to a source electrode. In other embodiments, the second well region 106 having the second type conductivity is replaced by a body doped region having the second type conductivity, and the semiconductor device has a LDMOS structure characteristics.

In embodiments, an ESD protection efficiency of the semiconductor device 100 can be improved by using the third doped contact regions (comprising the third doped contact regions 130, 136, 138 etc.) surrounded by the second doped contact regions 124, 126, at the drain side. The well doped region 132 under the first doped contact region 122 at the drain side can force an ESD current to flow along a sub-surface, and therefore can improve an ESD protection efficiency of the semiconductor device 100. A parasitic bipolar junction transistor (BJT) formed in the semiconductor device 100 can also improve the ESD protection efficiency of the semiconductor device 100. For example, the parasitic BJT may comprise a parasitic PNP BJT formed by the well doped region 132 and the first well region 104 having the first type conductivity, and the third doped contact region 128, 130 and the second well region 106 having the second type conductivity; or a parasitic PNP BJT formed by the well doped region 132 and the first well region 104 having the first type conductivity, and the third doped contact regions 134, 136 and the second well region 106 having the second type conductivity, or other parasitic BJTs formed by other element designs.

In embodiments, elements sizes and arrangement designs of the semiconductor device 100 can be adjusted properly for better operating electric characteristics. For example, a gap distance between a channel region in the second well region 106 and the well doped region 132 can be reduced for decreasing a breakdown voltage and a trigger voltage of the semiconductor device 100. A size ratio of the first well region 104 to the second well region 106 can be reduced for decreasing a breakdown voltage of the semiconductor device 100 thus able to be functioned as a power clamp ESD protection device. The semiconductor device 100 is not limited to the design as shown in FIG. 1. In other embodiments, the structures of the elements can be properly varied in a strip shape, a rectangle shape, a hexagonal shape, an octagonal shape, a circle shape, a square shape, etc. Conductive elements (for example, comprising the conductive elements 140, 142, 144, 146, 148, 150, 152, 154 as shown in FIG. 1, FIG. 2A to FIG. 2D, etc) are not limited to the arrangement and number as shown in FIG. 1. For example, the quantity of the conductive elements electrically connected to the first doped contact region 122, the second doped contact regions 124, 126 may be changed to be more or less. In one embodiment, for example, at the drain side, a density of the conductive elements electrically connected to the third doped contact regions (for example comprising the third doped contact regions 128, 134, etc): a density of the conductive elements electrically connected to the first doped contact region 122 may be 1:1-10. The semiconductor device 100 may have additional elements for improving operating characteristics. For example, an buried layer having a conductivity type same with the first well region 104, such as N type conductivity, may be formed under the first well region 104 for improving an isolation effect of the device.

Figure 3:
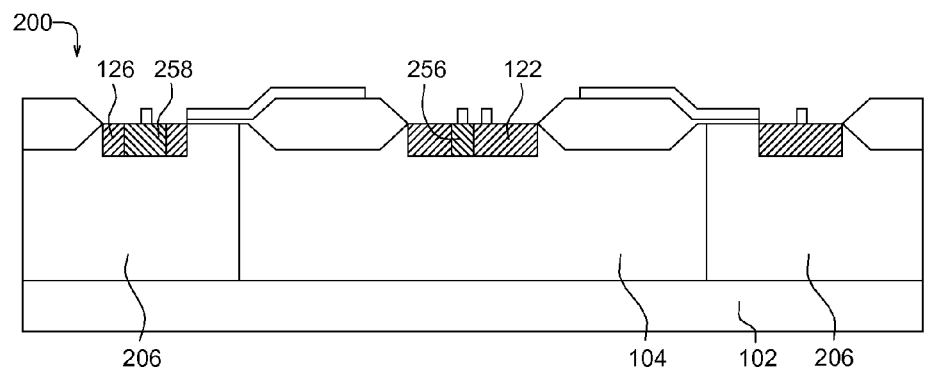
FIG. 3 illustrates a top view of some elements of a semiconductor device according to one embodiment.

FIG. 3 illustrates a cross-section view of the semiconductor device 200 according to another embodiment. It is different from the semiconductor device 100 as shown in FIG. 2A in that the second well region 206 is extended down to contact with the semiconductor substrate 102. The third doped contact region 256 and a third doped contact region 258 are surrounded by the first doped contact region 122 and the second doped contact region 126, respectively.

Figure 4:
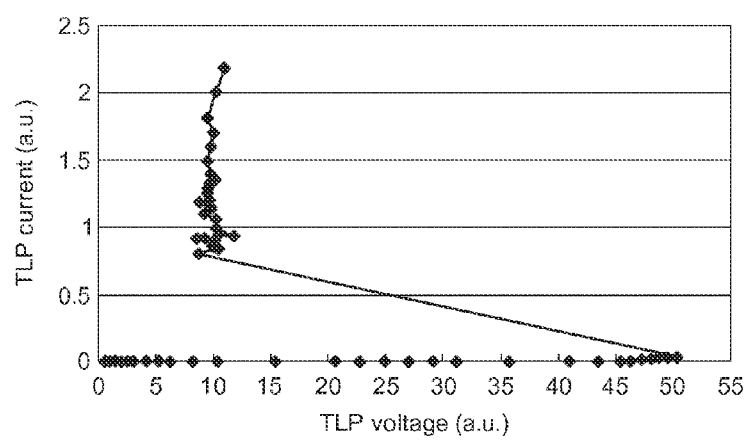
FIG. 4 shows a transmission line pulse (TLP) curve of a semiconductor device of one embodiment.
Figure 5:
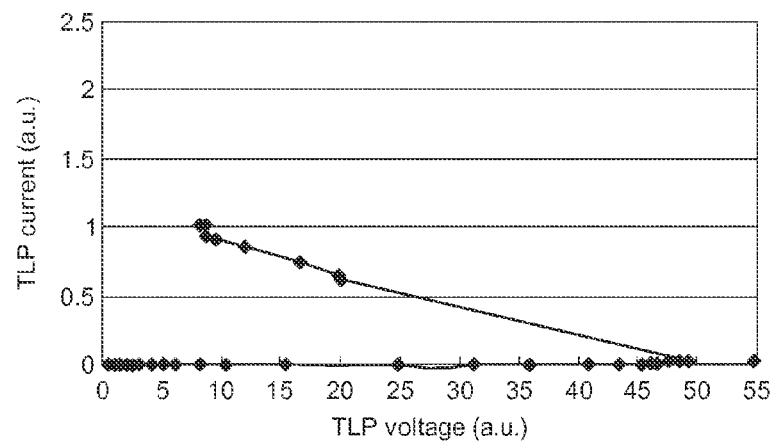
FIG. 5 shows a TPL curve of a semiconductor device of comparative example.

FIG. 4 shows a transmission line pulse (TLP) curve of the semiconductor device of one embodiment. FIG. 5 shows a TPL curve of a semiconductor device of comparative example. The semiconductor device of comparative example do not have the third doped contact region and the well doped region of that of embodiment. The semiconductor devices of embodiment and comparative example have the same device total width and the same gap distance of the gate structure to the drain contact. From FIG. 4 and FIG. 5, it is observed that a TLP current of embodiment is 2.2 times of a TLP current of comparative example. In addition, the semiconductor devices of embodiment and comparative example have substantial the same trigger voltage and the holding voltage.

FIG. 6A to FIG. 6D illustrate a manufacturing method for the semiconductor device according to one embodiment.

Figure 6A:
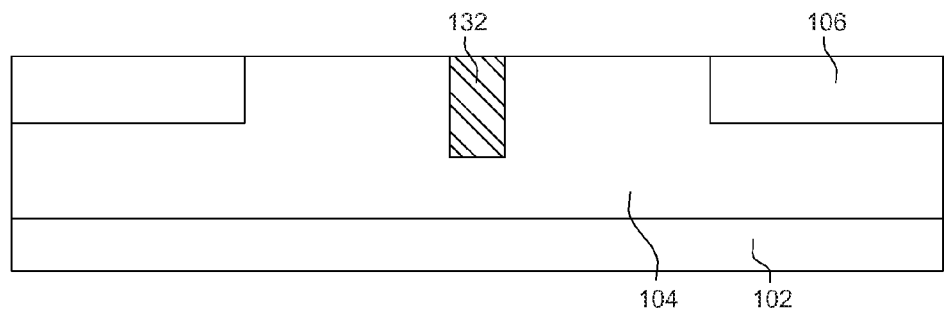
FIG. 6A to FIG. 6D illustrate a manufacturing method for a semiconductor device according to one embodiment.

Referring to FIG. 6A, the semiconductor substrate 102 is provided. The semiconductor substrate 102 may comprise silicon or other suitable materials. The semiconductor substrate 102 may comprise a SOI. The semiconductor substrate 102 may be formed by an epitaxial method, or a non-epitaxial method. The first well region 104 is formed in the semiconductor substrate 102. The second well region 106 is formed in the first well region 104. The well doped region 132 is formed in the first well region 104. The first well region 104, the second well region 106 and the well doped region 132 may be formed by a method comprising an ion implantation step. In other embodiments, the first well region 104 may be formed from the semiconductor substrate 102 by an epitaxial method.

Figure 6B:
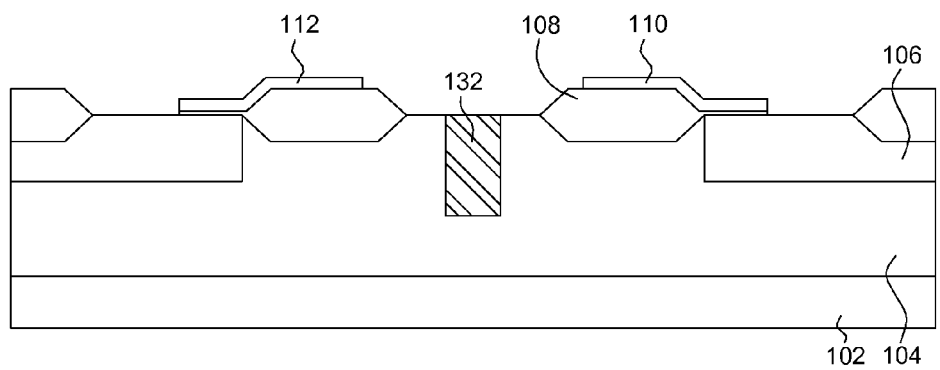

Referring to FIG. 6B, the dielectric structure 108 is formed on the first well region 104 and the second well region 106. The dielectric structure 108 is not limited to FOX structures as shown in figures, and may comprise shallow trench isolation (STI) structures. The dielectric structure 108 may comprise an oxide, a nitride, such as silicon oxide, silicon nitride, or other suitable materials, or a combination thereof. The gate structures 110, 112 are formed on the second well region 106. Each of the gate structures 110, 112 comprises a gate dielectric layer and a gate electrode layer on the gate dielectric layer. The gate dielectric layer may comprise an oxide, a nitride, such as silicon oxide, silicon nitride, or other suitable materials, or a combination thereof. A thickness of the gate dielectric layer may be adjusted properly. The gate electrode layer may comprise a metal, a metal silicide, such as W, Cu, SiW, or other suitable materials. In one embodiment, the gate structures 110, 112 may be formed by a single poly process, a double poly process, or other suitable methods.

Figure 6C:
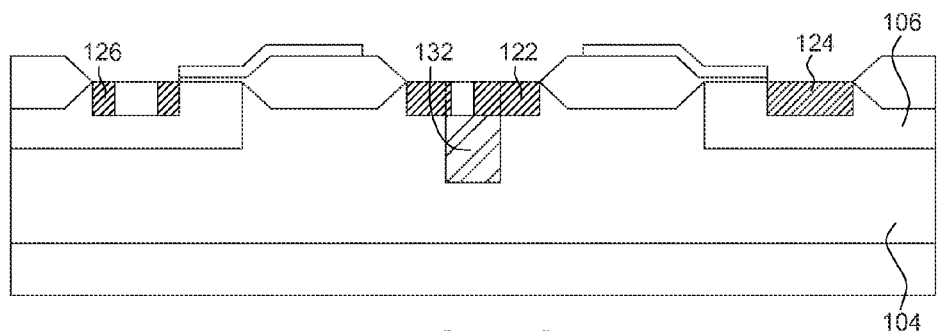

Referring to FIG. 6C, the first doped contact region 122 is formed in the first well region 104 and the well doped region 132, and the second doped contact regions 124, 126 are formed in the second well region 106, by a method comprising an ion implantation step.

Figure 6D:
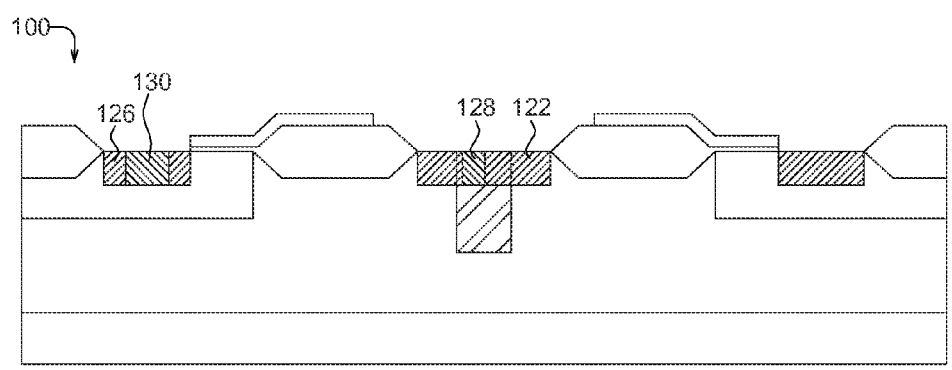

Referring to FIG. 6D, the third doped contact region 128 is formed in the first doped contact region 122, and the third doped contact region 130 is formed in the second doped contact region 126, by a method comprising an ion implantation step.

In other embodiments, the process step order may be adjusted properly. For example, the well doped region 132 may be formed after the first doped contact region 122, the second doped contact regions 124, 126 are formed. The first doped contact region 122, the second doped contact regions 124, 126 may be formed after the third doped contact regions 128, 130 are formed. The dielectric structure 108, the gate structures 110, 112 may be formed after the well doped region 132, the first doped contact region 122, the second doped contact regions 124, 126, the third doped contact regions 128, 130 are formed.

In embodiments, the semiconductor device 100 may be manufactured by any standard process. Additional masks are not needed. Therefore, manufacturing cost is low, and the manufacturing process is simple.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a semiconductor substrate;
   a gate structure on the semiconductor substrate and having a first gate sidewall and a second gate sidewall opposite to the first gate sidewall;
   a first well region having the first type conductivity, formed in the semiconductor substrate;
   a second well region having a second type conductivity formed in the semiconductor substrate
   a first doped contact region having a first type conductivity, formed in the first well region and merely disposed on one side of the gate structure adjacent to the first gate sidewall;
   a second doped contact region having the first type conductivity, formed in the second well region and merely disposed on one side of the gate structure adjacent to the second gate sidewall;
   a third doped contact region surrounded by and directly in contact with at least one of the first doped contact region and the second doped contact region, the third doped contact region having the second type conductivity opposite to the first type conductivity.

2. The semiconductor device according to claim 1, wherein the third doped contact region comprises a plurality of the third doped contact regions separated form each other by the first doped contact region or the second doped contact region.

3. The semiconductor device according to claim 1, wherein the third doped contact region comprises a plurality of the third doped contact regions,
   a portion of the plurality of the third doped contact regions is surrounded by the first doped contact region;
   another portion of the plurality of the third doped contact regions is surrounded by the second doped contact region.

4. The semiconductor device according to claim 1, wherein the first doped contact region is electrically connected to one of a source electrode and a drain electrode,
   the second doped contact region is electrically connected to the other of the source electrode and the drain electrode,
   as the third doped contact region is surrounded by the first doped contact region, the third doped contact region is electrically connected to the one of the source electrode and the drain electrode;
   as the third doped contact region is surrounded by the second doped contact region, the third doped contact region is electrically connected by the other of the source electrode and the drain electrode.

5. The semiconductor device according to claim 1, wherein first well region and the second well region have a PN junction formed there between.

6. The semiconductor device according to claim 1, wherein the semiconductor device is an extended-drain-MOSFET (EDMOS).

7. The semiconductor device according to claim 1, wherein the semiconductor device is functioned as an ESD protection device.

8. A semiconductor device, comprising:
   a semiconductor substrate;
   a gate structure on the semiconductor substrate and having a first gate sidewall and a second gate sidewall opposite to the first gate sidewall;
   a first doped contact region having a first type conductivity formed in the semiconductor substrate and merely disposed on one side of the gate structure adjacent to the first gate sidewall;

a second doped contact region having the first type conductivity, formed in the semiconductor substrate and merely disposed on one side of the gate structure adjacent to the second gate sidewall;

a third doped contact region surrounded by and directly in contact with the first doped contact region, the third doped contact region having a second type conductivity opposite to the first type conductivity;

a first well region having the first type conductivity, formed under the first doped contact region and allowing the first doped contact region being formed therein; and a second well region having the second type conductivity, formed in the semiconductor substrate and allowing the second doped contact region being formed therein.

9. The semiconductor device according to claim 8, wherein the first doped contact region is electrically connected to one of a source electrode and a drain electrode, the second doped contact region is electrically connected to the other of the source electrode and the drain electrode.

10. The semiconductor device according to claim 8, wherein the first well region and the second well region have a PN junction there between.

11. The semiconductor device according to claim 8, wherein the semiconductor device is an EDMOS.

12. The semiconductor device according to claim 8, wherein the semiconductor device is functioned as an ESD protection device.

13. A method for manufacturing a semiconductor device, comprising:

forming a gate structure having a first gate sidewall and a second gate sidewall opposite to the first gate sidewall on a semiconductor substrate;

forming a first well region having a first type conductivity in the semiconductor substrate;

forming a first doped contact region having the first type conductivity in the first well region and merely disposed on one side of the gate structure adjacent to the first gate sidewall;

forming a second well region having a second type conductivity in the first well region;

forming a second doped contact region having the first type conductivity in the second well region and merely disposed on one side of the gate structure adjacent to the second gate sidewall; and forming a third doped contact region surrounded by and directly in contact with at least one of the first doped contact region and the second doped contact region, the third doped contact region has the second type conductivity opposite to the first type conductivity.

14. The method for manufacturing the semiconductor device according to claim 13, further comprising forming a well doped region having the first type conductivity under the first doped contact region.

* * * * *